(12) United States Patent
Halbert et al.

(10) Patent No.: US 9,842,021 B2
(45) Date of Patent: Dec. 12, 2017

(54) MEMORY DEVICE CHECK BIT READ MODE

(71) Applicant: Intel Corporation, Santa Clara, CA (US)

(72) Inventors: John B Halbert, Beaverton, OR (US); Kuljit S Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/998,059

(22) Filed: Dec. 26, 2015

(65) Prior Publication Data
US 2017/0060680 A1     Mar. 2, 2017

Related U.S. Application Data

(60) Provisional application No. 62/211,448, filed on Aug. 28, 2015.

(51) Int. Cl.
*G06F 11/10*     (2006.01)
*G11C 29/52*     (2006.01)
(Continued)

(52) U.S. Cl.
CPC .......... *G06F 11/1048* (2013.01); *G06F 3/064* (2013.01); *G06F 3/0619* (2013.01); *G06F 3/0679* (2013.01); *G06F 11/1068* (2013.01); *G11C 29/42* (2013.01); *G11C 29/52* (2013.01); *H03M 13/095* (2013.01); *H03M 13/6566* (2013.01); *G11C 11/401* (2013.01)

(58) Field of Classification Search
CPC ............ G06F 11/1068; G06F 11/1072; G06F 3/0679; G06F 3/064; G06F 11/1048; G06F 3/0379; G11C 29/52
See application file for complete search history.

(56) References Cited

U.S. PATENT DOCUMENTS 5,638,385 A     6/1997 Fifield et al.
6,052,818 A     4/2000 Dell et al.
(Continued)

OTHER PUBLICATIONS

International Search Report and Written Opinion for PCT Patent Application No. PCT/US2016/045639, dated Nov. 7, 2016, 12 pages.

(Continued)

*Primary Examiner* — Shelly A Chase
(74) *Attorney, Agent, or Firm* — Compass IP Law PC

(57) ABSTRACT

A check bit read mode enables a memory device to provide internal check bits to an associated host. A memory controller of a memory subsystem can generate one or more read commands for memory devices of the memory subsystem. The read command can include address location information. The memory devices include memory arrays with memory locations addressable with the address location information. The memory locations have associated data and internal check bits, where the check bits are generated internally by the memory for error correction. If the memory device is configured for check bit read mode, in response to the read command, it sends the internal check bits associated with the identified address location. If the memory device is not configured check bit read mode, it returns the data in response to the read command without exposing the internal check bits.

21 Claims, 7 Drawing Sheets

(51) Int. Cl.
*G06F 3/06* (2006.01)
*H03M 13/09* (2006.01)
*H03M 13/00* (2006.01)
*G11C 29/42* (2006.01)
*G11C 11/401* (2006.01)

(56) References Cited

U.S. PATENT DOCUMENTS

| | | |
|---|---|---|
| 6,487,685 B1 | 11/2002 | Fiske et al. |
| 6,957,378 B2 | 10/2005 | Koga et al. |
| 7,096,407 B2 | 8/2006 | Olarig |
| 7,650,558 B2 | 1/2010 | Rosenbluth et al. |
| 8,640,005 B2 | 1/2014 | Wilkerson et al. |
| 2005/0144551 A1 | 6/2005 | Nahas |
| 2007/0234182 A1 | 10/2007 | Wickeraad et al. |
| 2008/0229176 A1 | 9/2008 | Amez et al. |
| 2009/0249169 A1 | 10/2009 | Bains et al. |
| 2010/0257432 A1 | 10/2010 | Resnick |
| 2012/0054580 A1 | 3/2012 | Sakaue |
| 2013/0111308 A1* | 5/2013 | Sauber ............... G06F 11/1004 714/807 |
| 2013/0132797 A1 | 5/2013 | Arai |
| 2014/0122974 A1* | 5/2014 | Yun .................... G06F 11/1004 714/773 |
| 2014/0211579 A1 | 7/2014 | Lovelace |
| 2014/0337688 A1 | 11/2014 | Billing et al. |
| 2015/0067437 A1 | 3/2015 | Bains et al. |
| 2015/0243373 A1 | 8/2015 | Chun et al. |
| 2015/0331732 A1 | 11/2015 | Giovannini et al. |
| 2016/0048425 A1* | 2/2016 | Kim ...................... G11C 29/52 714/764 |
| 2016/0224412 A1 | 8/2016 | Healy et al. |
| 2016/0239663 A1 | 8/2016 | Healy et al. |

OTHER PUBLICATIONS

International Search Report and Written Opinion for PCT Patent Application No. PCT/US2016/045640, dated Nov. 14, 2016, 13 pages.

International Search Report and Written Opinion for PCT Patent Application No. PCT/US2016/045643, dated Nov. 16, 2016, 15 pages.

* cited by examiner

MODE REGISTER (MRx) 310

| | ADDRESS | OPERATING MODE | DESCRIPTION |
|---|---|---|---|
| 312 | Ay | CHECK BIT READ (CBRD) | 0=RD CMD DECODED AS STANDARD READ FROM CA (A[9:0])<br>1=RD CMD TRIGGERS READ OF ERROR BITS FOR CA (A[9:0]) |

FIG. 3A

COMMAND TABLE 320

| | CMD | CKE CK_t (n-1) | CKE CK_t (n) | CS_n | ACT_n | RAS_n /A16 | CAS_n /A15 | WE_n /A14 | BG0-BG2 | BA0-BA1 | C2-C0 | A12/ BC_n | A17, A13, A11 | A10 /AP | A0-A9 |
|---|---|---|---|---|---|---|---|---|---|---|---|---|---|---|---|
| 322 | RD | H | H | L | H | H | L | H | BG | BA | V | V | V | L | CA |
| 324 | RDS4 | H | H | L | H | H | L | H | BG | BA | V | L | V | L | CA |
| 326 | RDS8 | H | H | L | H | H | L | H | BG | BA | V | H | V | L | CA |
| 328 | RDA | H | H | L | H | H | L | H | BG | BA | V | V | V | H | CA |
| 330 | RDAS4 | H | H | L | H | H | L | H | BG | BA | V | L | V | H | CA |
| 332 | RDAS8 | H | H | L | H | H | L | H | BG | BA | V | H | V | H | CA |

FIG. 3B

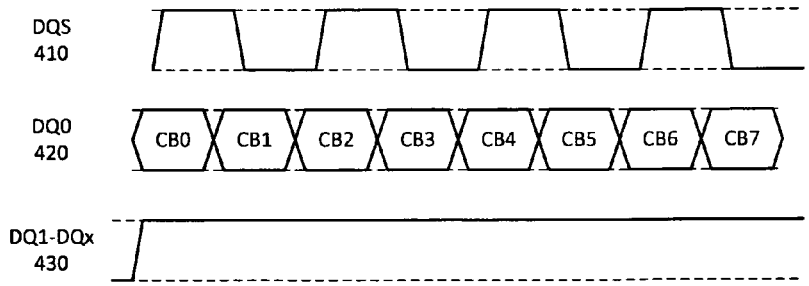

FIG. 4

MEMORY DEVICE CHECK BIT READ MODE

RELATED APPLICATIONS

This patent application is a nonprovisional application based on U.S. Provisional Application No. 62/211,448, filed Aug. 28, 2015. This application claims the benefit of priority of that provisional application. The provisional application is hereby incorporated by reference.

The present patent application is related to the following two patent applications, which also claim priority to the same U.S. Provisional Application identified above: U.S. patent application Ser. No. 14/998,184, entitled "MEMORY DEVICE ERROR CHECK AND SCRUB MODE AND ERROR TRANSPARENCY"; and, U.S. patent application Ser. No. 14/998,142, entitled "MEMORY DEVICE ON-DIE ECC (ERROR CHECKING AND CORRECTING) CODE"; both filed concurrently herewith.

FIELD

The descriptions are generally related to memory management, and more particular descriptions are related to error correction in a memory subsystem with a memory device that performs internal error correction.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2015, Intel Corporation, All Rights Reserved.

BACKGROUND

Volatile memory resources find widespread usage in current computing platforms, whether for servers, desktop or laptop computers, mobile devices, and consumer and business electronics. DRAM (dynamic random access memory) devices are the most common types of memory devices in use. However, DRAM errors are projected to increase as the manufacturing processes to produce the DRAMs continue to scale to smaller geometries. One technique for addressing the increasing DRAM errors is to employ on-die ECC (error checking and correction). On-die ECC refers to error detection and correction logic that resides on the memory device itself. With on-die ECC logic, a DRAM can correct single bit failures, such as through a single error correction (SEC) or single error correction, dual error detection (SECDED) techniques. On-die ECC can be used in addition to system level ECC, but the system level ECC has no insight into what error correction has been performed at the memory device level. However, providing details of error correction performed by the DRAM would expose sensitive data about the design and operation of the DRAMs.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 3A is a block diagram of an embodiment of a mode register that enables a check bit read mode.

FIG. 3B is a block diagram of an embodiment of read commands, including a read command that can trigger a memory device to return internal check bits when in check bit read mode.

FIG. 4 is a timing diagram of an embodiment of a check bit read mode.

Figure 1:
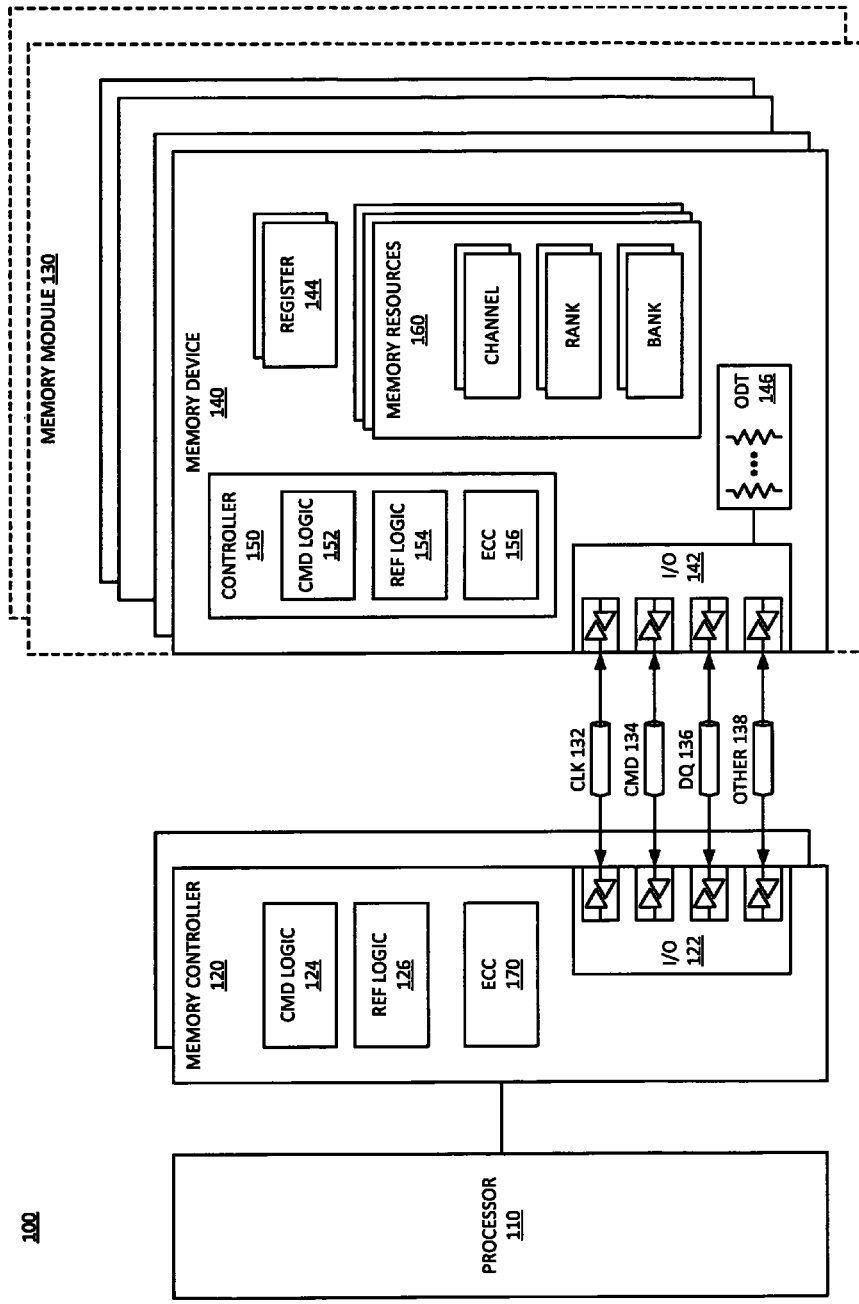
FIG. 1 is a block diagram of an embodiment of a system in which a memory device exposes internal check bits to a host in a check bit read mode.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a check bit read mode enables a memory device to provide selected error correction information to an associated host. Namely, in one embodiment, a memory device generates and stores internal check bits for use in error correction internally to the memory device. The check bits refer to code bits for use in determining or identifying errors in an error correction operation. In one embodiment, the check bits are parity check bits. For example, the check bits can be ECC (error correction coding) bits resulting from performing matrix-based error correction. In one embodiment, the check bits are bits used to generate a syndrome to compare against an H-matrix in error correction. In one embodiment, the check bits are code bits required to implement a Hamming operation. In one embodiment, each memory location stores check bits for the associated data bits.

In response to a read command in the check bit read mode, the memory device can return the internal check bits to the host. A memory controller of a memory subsystem can generate one or more read commands for memory devices of the memory subsystem. The read command can include address location information. The memory devices include memory arrays with memory locations addressable with the address location information. The memory locations have associated data and internal check bits, where the check bits are generated internally by the memory for internal error correction. If the memory device is configured for check bit read mode, in response to the read command, it sends the internal check bits associated with the identified address location. In one embodiment, if the memory device is not configured check bit read mode, it returns the data in response to the read command without exposing the internal check bits. In one embodiment, in response to the read command in check bit read mode, the memory device returns the check bits through one read burst, and returns the data bits or code word bits in a separate read burst either directly before or directly after the check bit read burst.

The host can utilize the internal check bits to improve system-level RAS (reliability, accessibility, and serviceability) of the memory subsystem. Thus, by the memory controller accessing and the memory device providing access to the internal check bits, the system as a whole can perform improved error correction. It will be understood that the memory device can provide check bits without providing access to sensitive information, such as internal correction data that identifies erroneous bits of the memory device. In one embodiment, a memory subsystem enables the exchange of internal check bits from the memory device, which can provide only selected information about corrections at the memory device level. Specifically, by generating check bits for corrected data and providing such check bits to the host or memory controller, the memory device can provide check bits to the memory controller that will be indistinguishable for single bit error (SBE) conditions that have been internally corrected, and no error conditions.

Thus, the check bit read mode enables the memory controller access to error correction information that can improve system level error correction without revealing private information. In one embodiment, a memory controller can extract multibit error information from the check bits, and apply the multibit information to determine how to apply ECC to the system (e.g., by knowing where errors occurred in the memory). In one embodiment, the memory controller uses the internal check bits from the memory device as metadata for improving SDDC (single device data correction) ECC operations targeting multibit errors.

In one embodiment, the check bit read mode can be referred to as a CBRD mode. In one embodiment, a typical read command (RD) results in a memory device returning burst length of data bits (e.g., a burst length of eight cycles, or BL8). In one embodiment, when a mode register (e.g., MRy) has one or more bits set (e.g., bit A[x]), the same RD command causes the memory device to return internal ECC check bits associated with the column address (CA) being addressed for the read cycle. In one embodiment, the memory device returns the check bits on the lowest address signal line (DQ[0]). It will be understood that a different signal line can alternatively be used. Thus, when the number of check bits is equal to the number of cycles of the burst length (e.g., BL8 and 8 check bits), each cycle of the burst length can return one check bit. In an embodiment where there are different numbers of check bits and burst cycles (e.g., where BLN is used, and M check bits are used, where N and M are integers, and M≠N), then different check bit return operations can be performed. For example, where M>N, more than one data bus signal line can be used. As another example, where M<N, one or more check bits can be sent for each of multiple first cycles, and then additional burst cycles can include no check bits.

In one embodiment, where selected signal lines (e.g., a single signal line, such as DQ[0]) is used to send check bits, the other signal lines can be driven to a logic '1'. For example, in one embodiment, BL8 is used with 8 check bits. Different signal lines can be held high for different interface configurations. For example, a x4 configuration refers to a data bus width of 4 bits for each connected memory device or DRAM (dynamic random access memory device). Other common interface configurations include x8 (an 8-bit wide interface), and x16 (a 16-bit wide interface). Configurations of x32 (a 32-bit wide interface) are currently less common for many memory subsystem implementations. For configurations of x4, x8, and x16, respectively, in one embodiment a DRAM will hold DQ[1:3], DQ[1:7], or DQ[1:15] at a logic '1' while transmitting the check bits.

In one embodiment, a memory device supports multiple different types of read commands (for example, see the discussion of FIG. 3B below). In one embodiment, only a standard Read command (RD) is defined to be supported in CBRD mode. In such an embodiment, other read command types or other types of commands (such as a Write command) will result in an error. In one embodiment, in response to another type of command while in CBRD mode, the memory device will ignore the CBRD mode and return the data.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory devices, or memory devices that use chalcogenide phase change material (e.g., chalcogenide glass). In one embodiment, the memory device can be or include multithreshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "DRAM" can apply to any memory device that allows random access, whether volatile or nonvolatile. The memory device or DRAM can refer to the die itself and/or to a packaged memory product.

FIG. 1 is a block diagram of an embodiment of a system in which a memory device exposes internal check bits to a host in a check bit read mode. System 100 includes elements of a memory subsystem in a computing device. Processor 110 represents a processing unit of a host computing platform that executes an operating system (OS) and applications, which can collectively be referred to as a "host" for the memory. The OS and applications execute operations that result in memory accesses. Processor 110 can include one or more separate processors. Each separate processor can include a single and/or a multicore processing unit. The processing unit can be a primary processor such as a CPU (central processing unit) and/or a peripheral processor such as a GPU (graphics processing unit). System 100 can be implemented as an SOC, or be implemented with standalone components.

Memory controller 120 represents one or more memory controller circuits or devices for system 100. Memory controller 120 represents control logic that generates memory access commands in response to the execution of operations by processor 110. Memory controller 120 accesses one or more memory devices 140. Memory devices 140 can be DRAMs in accordance with any referred to above. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. In one embodiment, settings for each channel are controlled by separate mode register or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a system bus. I/O interface logic 122 (as well as I/O 142 of memory device 140) can include pins, connectors, signal lines, and/or other hardware to connect the devices. I/O interface logic 122 can include a hardware interface. Typically, wires within an integrated circuit interface with a pad or connector to interface to signal lines or traces between devices. I/O interface logic 122 can include drivers, receivers, transceivers, termination, and/or other circuitry to send and/or receive signal on the signal lines between the devices. The system bus can be implemented as multiple signal lines coupling memory controller 120 to memory devices 140. The system bus includes at least clock (CLK) 132, command/address (CMD) 134, data (DO) 136, and other signal lines 138. The signal lines for CMD 134 can be referred to as a "C/A bus" (or ADD/CMD bus, or some other designation indicating the transfer of commands and address information) and the signal lines for DQ 136 be referred to as a "data bus." In one embodiment, independent channels have different clock signals, C/A buses, data buses, and other signal lines. Thus, system 100 can be considered to have multiple "system buses," in the sense that an independent interface path can be considered a separate system bus. It will be understood that in addition to the lines explicitly shown, a system bus can include strobe signaling lines, alert lines, auxiliary lines, and other signal lines.

It will be understood that the system bus includes a data bus (DQ 136) configured to operate at a bandwidth. Based on design and/or implementation of system 100, DQ 136 can have more or less bandwidth per memory device 140. For example, DQ 136 can support memory devices that have either a x32 interface, a x16 interface, a x8 interface, or other interface. The convention "xN," where N is a binary integer refers to an interface size of memory device 140, which represents a number of signal lines DQ 136 that exchange data with memory controller 120. The interface size of the memory devices is a controlling factor on how many memory devices can be used concurrently per channel in system 100 or coupled in parallel to the same signal lines.

Memory devices 140 represent memory resources for system 100. In one embodiment, each memory device 140 is a separate memory die, which can include multiple (e.g., 2) channels per die. Each memory device 140 includes I/O interface logic 142, which has a bandwidth determined by the implementation of the device (e.g., x16 or x8 or some other interface bandwidth), and enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 130. In one embodiment, memory modules 130 represent dual inline memory modules (DIMMs). In one embodiment, memory modules 130 represent other organization of multiple memory devices to share at least a portion of access or control circuitry, which can be a separate circuit, a separate device, or a separate board from the host system platform. Memory modules 130 can include multiple memory devices 140, and the memory modules can include support for multiple separate channels to the included memory devices disposed on them.

Memory devices 140 each include memory resources 160. Memory resources 160 represent individual arrays of memory locations or storage locations for data. Typically memory resources 160 are managed as rows of data, accessed via cacheline (rows) and bitline (individual bits within a row) control. Memory resources 160 can be organized as separate channels, ranks, and banks of memory. Channels are independent control paths to storage locations within memory devices 140. Ranks refer to common locations across multiple memory devices (e.g., same row addresses within different devices). Banks refer to arrays of memory locations within a memory device 140. In one embodiment, banks of memory are divided into sub-banks with at least a portion of shared circuitry for the sub-banks.

In one embodiment, memory devices 140 include one or more registers 144. Registers 144 represent storage devices or storage locations that provide configuration or settings for the operation of the memory device. In one embodiment, registers 144 can provide a storage location for memory device 140 to store data for access by memory controller 120 as part of a control or management operation. In one embodiment, registers 144 include Mode Registers. In one embodiment, registers 144 include multipurpose registers. The configuration of locations within register 144 can configure memory device 140 to operate in different "mode," where command and/or address information or signal lines can trigger different operations within memory device 140 depending on the mode. Settings of register 144 can indicate configuration for I/O settings (e.g., timing, termination or ODT (on-die termination), driver configuration, and/or other I/O settings.

In one embodiment, memory device 140 includes ODT 146 as part of the interface hardware associated with I/O 142. ODT 146 can be configured as mentioned above, and provide settings for impedance to be applied to the interface to specified signal lines. The ODT settings can be changed based on whether a memory device is a selected target of an access operation or a non-target device. ODT 146 settings can affect the timing and reflections of signaling on the terminated lines. Careful control over ODT 146 can enable higher-speed operation.

Memory device 140 includes controller 150, which represents control logic within the memory device to control internal operations within the memory device. For example, controller 150 decodes commands sent by memory controller 120 and generates internal operations to execute or satisfy the commands. Controller 150 can determine what mode is selected based on register 144, and configure the access and/or execution of operations for memory resources 160 based on the selected mode. Controller 150 generates control signals to control the routing of bits within memory device 140 to provide a proper interface for the selected mode and direct a command to the proper memory locations or addresses.

Referring again to memory controller 120, memory controller 120 includes command (CMD) logic 124, which represents logic or circuitry to generate commands to send to memory devices 140. Typically, the signaling in memory subsystems includes address information within or accompanying the command to indicate or select one or more memory locations where the memory devices should execute the command. In one embodiment, controller 150 of memory device 140 includes command logic 152 to receive and decode command and address information received via I/O 142 from memory controller 120. Based on the received command and address information, controller 150 can control the timing of operations of the logic and circuitry within memory device 140 to execute the commands. Controller 150 is responsible for compliance with standards or specifications.

In one embodiment, memory controller 120 includes refresh (REF) logic 126. Refresh logic 126 can be used where memory devices 140 are volatile and need to be refreshed to retain a deterministic state. In one embodiment, refresh logic 126 indicates a location for refresh, and a type of refresh to perform. Refresh logic 126 can trigger self-refresh within memory device 140, and/or execute external refreshes by sending refresh commands. For example, in one embodiment, system 100 supports all bank refreshes as well as per bank refreshes. All bank refreshes cause the refreshing of a selected bank within all memory devices 140 coupled in parallel. Per bank refreshes cause the refreshing of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command.

In one embodiment, memory controller 120 includes ECC logic 170, which represents error correction and control logic to perform system-level ECC for system 100. System-level ECC refers to application of error correction at memory controller 120, and can apply error correction to data bits from multiple different memory devices 140. In one embodiment, controller 150 of memory device 140 includes ECC logic 156, which represents internal error correction logic for the memory device. Thus, in addition to system level error correction by memory controller 120, memory device 140 can apply internal error correction.

In one embodiment, memory controller 120 generates one or more commands to set one or more register settings in register 144 to configure memory device 140 for a check bit read mode. When in the CBRD mode, memory device 140 can return internal check bits used for ECC 156 in response to a read command. When a read command is received and the memory device is not configured for CBRD mode, the memory device can return the data bits for an identified address location without exposing the internal check bits.

Figure 2:
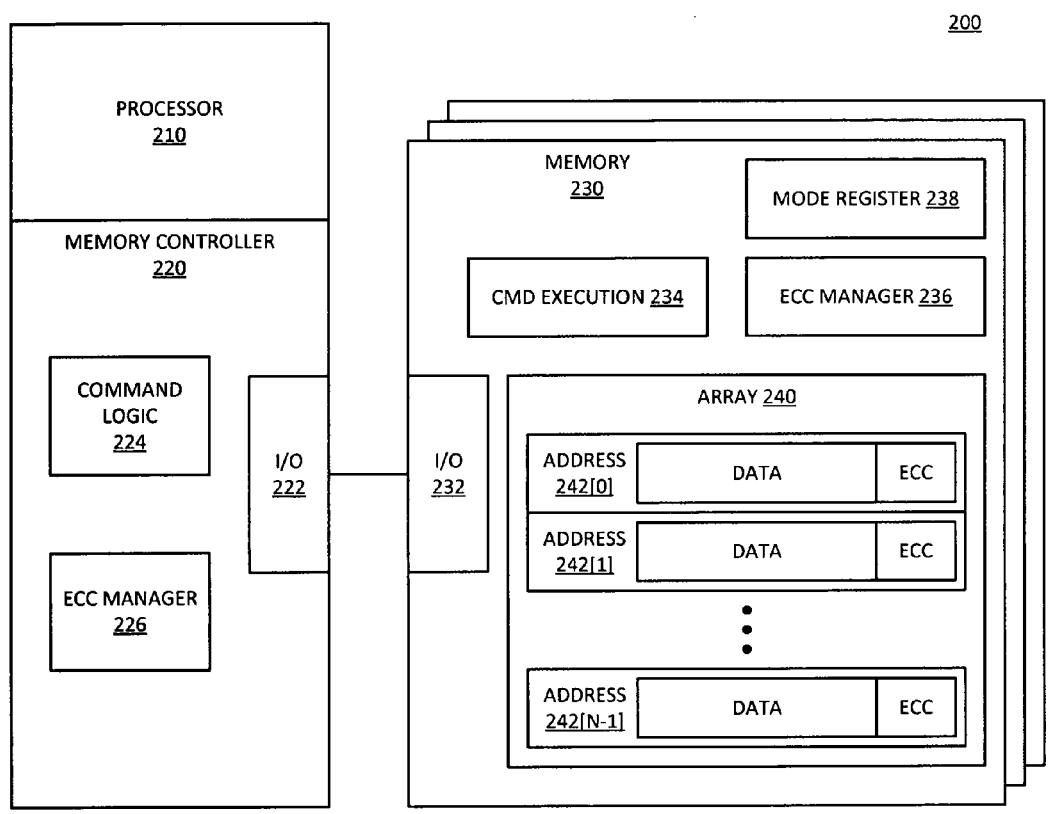
FIG. 2 is a block diagram of an embodiment of a system that stores ECC bits available to send to a host in a mode controlled by a mode register.

FIG. 2 is a block diagram of an embodiment of a system that stores ECC bits available to send to a host in a mode controlled by a mode register. System 200 represents components of a memory subsystem. System 200 provides one example of a memory subsystem in accordance with system 100 of FIG. 1. System 200 can be included in any type of computing device or electronic circuit that uses memory with internal ECC or error correction, where the memory devices store internal check bits. Processor 210 represents any type of processing logic or component that executes operations based on data stored in memory 230 or to store in memory 230. Processor 210 can be or include a host processor, central processing unit (CPU), microcontroller or microprocessor, graphics processor, peripheral processor, application specific processor, or other processor. Processor 210 can be or include a single core or multicore circuit.

Memory controller 220 represents logic to interface with memory 230 and manage access to data of memory 230. As with the memory controller above, memory controller 220 can be separate from or part of processor 210. Processor 210 and memory controller 220 together can be considered a "host" from the perspective of memory 230, and memory 230 stores data for the host. In one embodiment, memory 230 includes DDR4E DRAMs that have internal ECC (which may be referred to in the industry as DDR4E).

In one embodiment, system 200 includes multiple memory resources 230. Memory 230 can be implemented in system 200 in any type of architecture that supports access via memory controller 220 with use of internal ECC in the memory. Memory controller 220 includes I/O (input/output)

222, which includes hardware resources to interconnect with corresponding I/O 232 of memory 230.

In one embodiment, memory controller includes ECC manager 226 to manage error checking and correction in memory accesses of system 200. In one embodiment, memory 230 includes internal ECC managed by ECC manager 236. ECC manager 226 of memory controller 220 manages system wide ECC, and can detect and correct errors across multiple different memory resources in parallel (e.g., multiple memory resources 230). Many techniques for system wide ECC are known, and can include ECC manager 226 managing memory resources in a way to spread errors across multiple parallel resources. By spreading errors across multiple resources, memory controller 220 can recover data even in the event of one or more failures in memory 230. Memory failures are generally categorized as either soft errors or soft failures, which are transient bit errors typically resulting from random environmental conditions, or hard errors or hard failures, which are non-transient bit errors occurring as a result of a hardware failure.

ECC manager 236 of memory 230 manages one or more errors occurring in the memory resources of array 240. The use of ECC within memory 230 may be referred to as internal ECC or on-die ECC, or internal on-die ECC. In general, internal ECC refers to ECC implemented within memory 230, without command or management of the ECC operations by memory controller 220 or the host. Array 240 includes multiple rows of data, which can be one or more words wide. For memory 230 that implements ECC, array 240 includes spare memory resources used to internally map out failures to different physical resources. Thus, a failure in array 240 can be recovered by mapping the data to a different available memory resource and correcting the error. In one embodiment, ECC manager 236 implements SEC (single error correction) or SECDED (single error correction, double error detection) procedures or operations for data in array 240. Thus, memory 230 can return corrected data in place of data with an error.

In one embodiment, each address location 242 of array 240 includes associated data and check bits or ECC bits. In one embodiment, address locations 242 correspond to memory pages. A page of memory refers to a granular amount of memory space allocated for a memory access operation. In one embodiment, array 240 has a larger page size to accommodate the ECC bits in addition to the data bits. Thus, a normal page size would include enough space allocated for the data bits, and array 240 allocates enough space for the data bits plus the ECC bits. In one embodiment, the ECC bits are no visible to memory controller 220 except via a read path established by the CBRD mode. In one embodiment, there is no write path available to memory controller 220 for the ECC bits. Thus, in one embodiment, the host can write the data bits, and the memory generates and writes the ECC bits, and the host cannot write the ECC bits. The N address locations of addresses 242 represent N locations addressable via address information in a read command from the memory controller.

In one embodiment, memory 230 includes mode register 238, which represents one of multiple mode registers in the memory device. Each mode register stores configuration settings that configure the operation of memory 230. For example, in one embodiment, mode register 238 includes one or more settings relating to a check bit read (CBRD) mode for memory 230. When one or more bits are set to a determined pattern, memory 230 enters a CBRD mode, which configures how the memory will interpret a read command. In one embodiment, command logic 224 enables memory controller 220 to generate and send a command to set mode register 238. Typically mode register 238 is configured by memory controller 220.

When memory 230 is in CBRD mode, it can decode a read command sent from memory controller 220 differently than when the read command is received and the memory is not in CBRD mode. For example, command logic 224 can generate a standard read command—(RD). Command execution logic 234 of memory 230 receives and decodes the command. Command execution logic 234 can check the configuration of mode register 238 to determine if memory 238 is in CBRD mode. If the memory is not in CBRD mode, command execution logic 234 decodes the address location of the read command and reads data from array 240. Memory 230 then sends the data over a data bus via I/O 232. If the memory is in CBRD mode, command execution logic 234 decodes the address information of the read command and reads the internal check bits or ECC bits from array 240. Then memory 230 sends the ECC bits over a data bus via I/O 232.

FIG. 3A is a block diagram of an embodiment of a mode register that enables a check bit read mode. Mode register 310 represents an example of a mode register for a memory device that supports a CBRD mode in accordance with any embodiment described herein. Mode register 310 can be any mode register MRx of an SDRAM device. Mode register 310 would typically include multiple entries for different configuration information. However, for purposes of simplicity, mode register 310 is limited to illustrating entry 312, which represents a bit address Ay. The logic value of bit Ay can determine whether the memory device enters a check bit read operating mode.

It will be understood that the logic levels illustrated can be reversed. Additionally, it will be understood that while a CBRD mode can be set with a single bit, the CBRD mode can be set as a code sequence of multiple bits. Alternatively, CBRD mode can be part of a set of modes that are all configured with the same bits (e.g., two mode register bits that set four different input modes, including CBRD mode). In one embodiment, bit Ay determines whether the memory is configured for CBRD mode as follows. A logic 0 indicates that a read command (e.g., RD) is decoded as a standard read from the column address information of the RD command (e.g., bits A[9:0] of the RD command). A logic 1 indicates that the read command is decoded as a read of the error bits associated with the column address information of the read command (e.g., bits A[9:0] of the RD command). Other read commands and bit configurations are possible.

FIG. 3B is a block diagram of an embodiment of read commands, including a read command that can trigger a memory device to return internal check bits when in check bit read mode. Command table 320 represents an example of different read commands for a memory device that supports a CBRD mode in accordance with an embodiment described herein. In one embodiment of a memory subsystem, a memory device supports each of the different types of read commands in table 320. Other types of read commands may be possible. Some memory subsystems do not support all reads in table 320. Thus, the read commands of table 320 are to be understood as examples.

As illustrated, table 320 includes entries 322, 324, 326, 328, 330, and 332. Entry 322 represents a simple or a standard read command (RD). Entry 324 represents an on-the-fly read with burst chop (BC4). Entry 326 represents an on-the-fly read without burst chop (BL8). Entry 328 represents a read with auto-precharge (RDA), which can be a fixed burst length or a burst chop. Entry 330 represents a read with auto-precharge and burst chop (RDAS4). Entry 332 represents a read with auto-precharge without burst chop (RDAS8).

In one embodiment, the check bit read mode only supports a simple or standard read command. Thus, in one embodiment, a memory device can perform a check bit read in response to the RD command of entry 322, but will not return check bits in response to any other read commands of table 320. In one embodiment, RDS4 and BC4 are illegal in CBRD mode. In one embodiment, any write command, such as WR, WRS4/8, and WRAS4/8 are illegal in CBRD mode. In one embodiment, when a memory controller clears a mode register bit responsible for putting the memory device into CBRD mode, the memory device will return data bits for RD, RDS4/8, and BC4 commands.

FIG. 4 is a timing diagram of an embodiment of a check bit read mode. The timing diagram includes illustrations for DQS 410, DQ0 420, and DQ1-DQx 430. The timing diagram illustrates a timing of returning check bits in accordance with an embodiment of CBRD mode described herein. DQS 410 represents a data strobe or clock or timing signal that a DRAM uses to synchronize the exchange of data on a data bus. DQ0 420 represents a lowest-address signal line. While DQ0 is illustrated, it will be understood that another data signal line could be substituted for DQ0. As illustrated, a DRAM device provides eight check bits (CB[0:7]) over eight read cycles. The other signal lines, DQ1-DQx, do not transfer data over the data burst.

A DRAM interfaces with data signal lines via I/O circuitry. A DRAM determines in response to a read command whether the device is in CBRD mode. If the DRAM is in CBRD mode and it receives a valid read command, it can return the check bits to the host. Thus, in one embodiment, the DRAM outputs check bits in CBRD mode by outputting one bit per burst cycle over a read burst length for the DRAM. The illustration of DQ0 420 corresponds to a BL=8. The DRAM can output the check bits via data signal line D[0] or another selected signal line.

Figure 5:
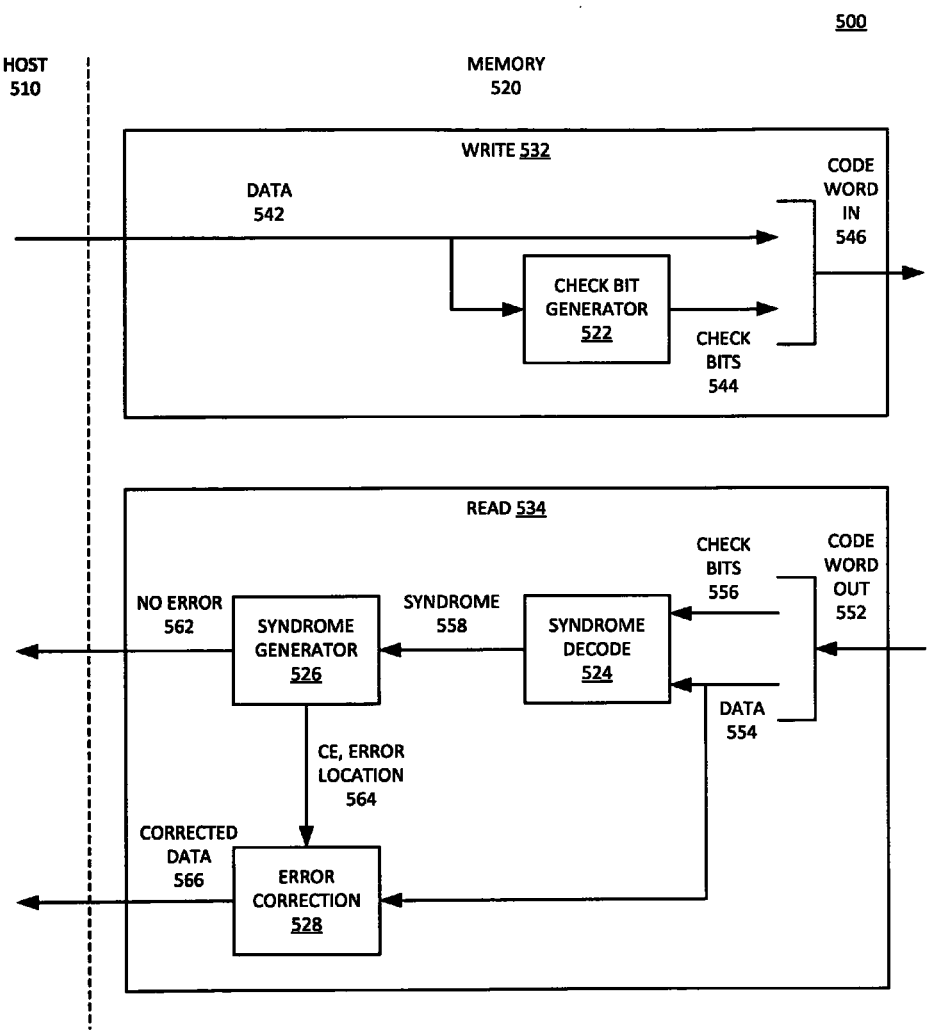
FIG. 5 is a block diagram of an embodiment of logic at a memory device that generates internal check bits available to the host via a check bit read mode.

FIG. 5 is a block diagram of an embodiment of logic at a memory device that generates internal check bits available to the host via a check bit read mode. System 500 is one example of a memory subsystem in accordance with system 100 of FIG. 1. System 500 provides an example of internal error correction by a memory device, which generates and stores internal check bits. Host 510 includes a memory controller or equivalent or alternative circuit or component that manages access to memory 520. Host 510 performs external ECC on data read from memory 520.

System 500 illustrates write path 532 in memory 520, which represents a path for data written from host 510 to memory 520. Host 510 provides data 542 to memory 520 for writing to the memory array(s). In one embodiment, memory 520 generates check bits 544 with check bit generator 522 to store with the data in memory, which can be one example of internal check bits in accordance with any embodiment herein. Check bits 544 can enable memory 520 to correct an error that might occur in the writing to and reading from the memory array(s). Data 542 and check bits 544 can be included as code word in 546, which is written to the memory resources. It will be understood that check bits 544 represent internal check bits within the memory device. In one embodiment, there is no write path to check bits 544.

Read path 534 represents a path for data read from memory 520 to host 510. In one embodiment, at least certain hardware components of write path 532 and read path 534 are the same hardware. In one embodiment, memory 520 fetches code word out 552 in response to a Read command from host 510. The code word can include data 554 and check bits 556. Data 554 and check bits 556 can correspond, respectively, to data 542 and check bits 544 written in write path 532, if the address location bits of the write and read commands are the same. It will be understood that error correction in read path 534 can include the application of an XOR (exclusive OR) tree to a corresponding H matrix to detect errors and selectively correct errors (in the case of a single bit error).

As is understood in the art, an H matrix refers to a hamming code parity-check matrix that shows how linear combinations of digits of the codeword equal zero. Thus, the H matrix rows identify the coefficients of parity check equations that must be satisfied for a component or digit to be part of a codeword. In one embodiment, memory 520 includes syndrome decode 524, which enables the memory to apply check bits 556 to data 554 to detect errors in the read data. Syndrome decode 524 can generate syndrome 558 for use in generating appropriate error information for the read data. Data 554 can also be forwarded to error correction 528 for correction of a detected error.

In one embodiment, syndrome decode 524 passes syndrome 558 to syndrome generator 526 to generate an error vector. In one embodiment, check bit generator 522 and syndrome generator 526 are fully specified by a corresponding H matrix for the memory device. In one embodiment, if there are no errors in the read data (e.g., zero syndrome 558), syndrome generator 526 generates a no error signal 562. In one embodiment, if there are multiple errors in the read data (e.g., non-zero syndrome 558 that does not match any of the columns in a corresponding H matrix), syndrome generator 526 could generate a signal (not shown) that indicates a detected uncorrected error. Such a signal can indicate a multibit error that memory 520 was not able to correct by internal ECC.

In one embodiment, if there is a single bit error (e.g., non-zero syndrome 558 that matches one of the columns of a corresponding H matrix), syndrome generator 526 can generate a CE (corrected error) signal with error location 564, which is a corrected error indication to error correction logic 528. Error correction 528 can apply the corrected error to the specified location in data 554 to generate corrected data 566 for output to host 510. Thus, it will be understood that memory 520 can perform internal error correction with exposing internal check bits. However, when memory 520 is in CBRD mode, it can return the check bits from the addressed location in accordance with any embodiment described herein.

Figure 6:
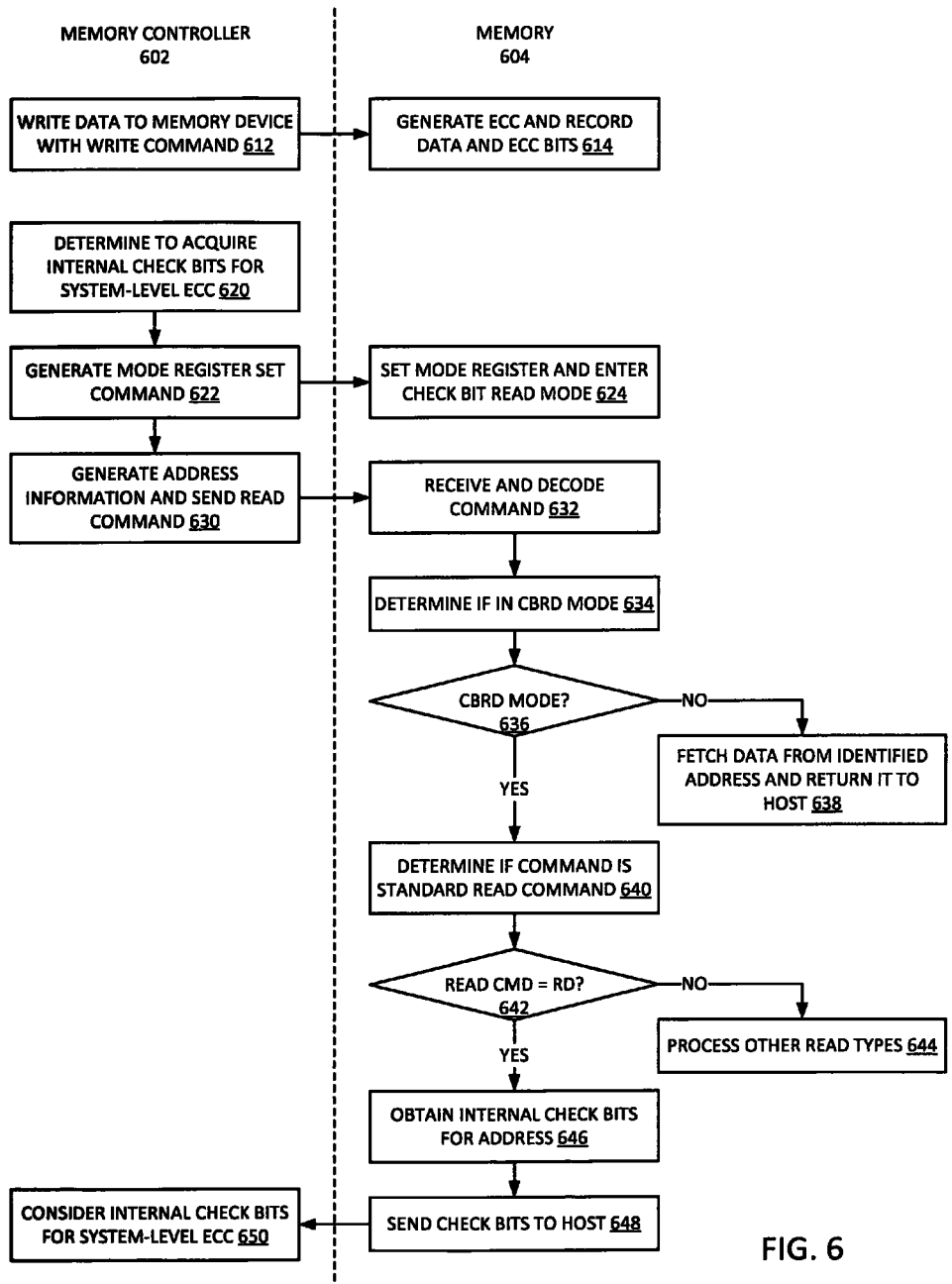
FIG. 6 is a flow diagram of an embodiment of a process for providing internal error correction information from a memory device to a host in check bit read mode.

FIG. 6 is a flow diagram of an embodiment of a process for providing internal error correction information from a memory device to a host in check bit read mode. The process for providing internal error correction information in CBRD mode can be performed in an embodiment of a memory subsystem that supports CBRD mode as described herein. A memory subsystem includes memory controller 602 and memory 604. The memory is selectively enabled for CBRD mode. CBRD mode can enable the memory to return the internal check bits to the memory controller in response to a read command.

In one embodiment, memory controller 602 writes data to the memory device with a write command, 612. In response to the write command, in one embodiment, memory 604 can generate internal error correction, including generating internal check bits. Memory 604 records or stores the data and corresponding ECC bits, 614.

In one embodiment, the memory controller determines to access the internal check bits from the memory, 620. For example, memory controller 602 can access the check bits to improve system-level ECC. In one embodiment, the memory controller generates a mode register set command to place the memory in CBRD mode, 622. In response to the command, the memory can set the mode register and enter check bit read mode, 624. The memory controller generates address information for the desired check bits, and sends a read command to the memory, 630. The memory receives and decodes the read command and address information, 632.

In one embodiment, the memory determines if it is in CBRD mode when decoding a read command, 634. If the memory is not in CBRD mode, 636 NO branch, the memory fetches the data requested at the address location, and returns it to the host, 638. In one embodiment, memory 604 only supports a certain read type or certain read types to return internal check bits. If the memory is in CBRD mode, 636 YES branch, in one embodiment, the memory determines if the read command is a standard read command or a special read command, 640. If the read command is not a simple read (RD) or other supported command, 642 NO branch, the memory processes the unsupported read type in accordance with a system configuration, 644. In one embodiment, if the read command is not a read command supported in CBRD mode, the memory device returns an error to the memory controller. In one embodiment, if the read command is not supported in CBRD mode, the memory automatically exits CBRD mode and processes the read command as requested.

If the read command is command supported in CBRD mode, 642 YES branch, the memory fetches the check bits for the identified address, 646. The memory sends the check bits to the host, 648. The memory can send the check bits in accordance with any embodiment described herein. In one embodiment, the memory sends the check bits one at a time on a selected data signal line. The memory controller receives the check bits and can factor the internal check bits into an operation of system-level ECC, 650.

Figure 7:
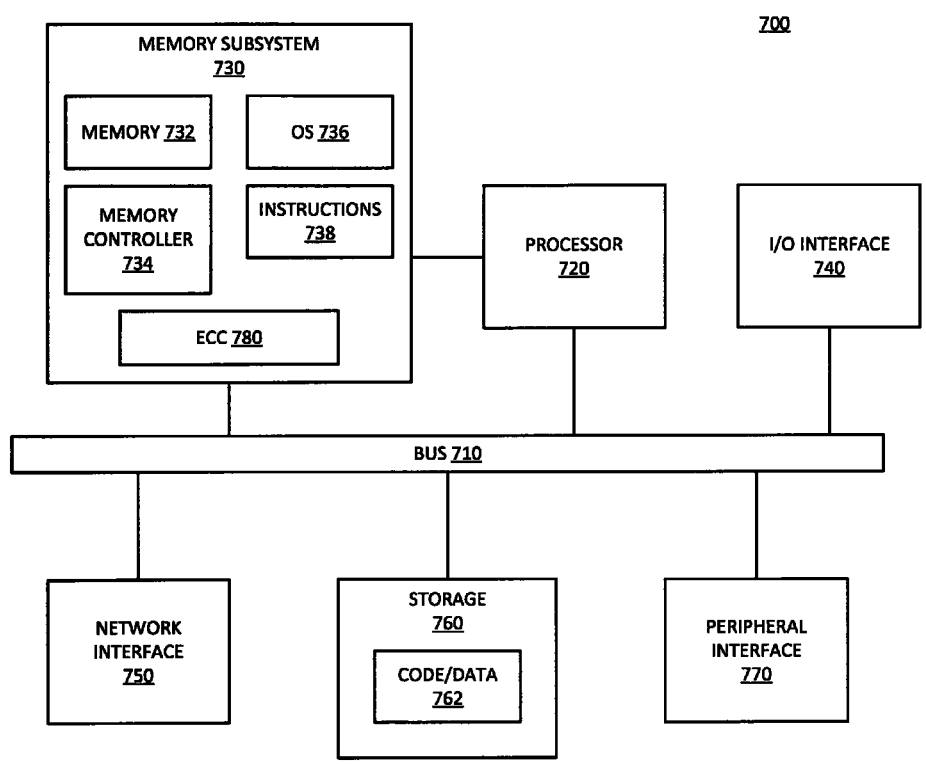
FIG. 7 is a block diagram of an embodiment of a computing system in which a check bit read mode to read internal check bits can be implemented.

FIG. 7 is a block diagram of an embodiment of a computing system in which a check bit read mode to read internal check bits can be implemented. System 700 represents a computing device in accordance with any embodiment described herein, and can be a laptop computer, a desktop computer, a server, a gaming or entertainment control system, a scanner, copier, printer, routing or switching device, or other electronic device. System 700 includes processor 720, which provides processing, operation management, and execution of instructions for system 700. Processor 720 can include any type of microprocessor, central processing unit (CPU), processing core, or other processing hardware to provide processing for system 700. Processor 720 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 can include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720. Memory subsystem 730 includes memory device 732 where it stores data, instructions, programs, or other items. In one embodiment, memory subsystem includes memory controller 734, which is a memory controller to generate and issue commands to memory device 732. It will be understood that memory controller 734 could be a physical part of processor 720.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 can also correspond to interfaces in network interface 750.

System 700 also includes one or more input/output (I/O) interface(s) 740, network interface 750, one or more internal mass storage device(s) 760, and peripheral interface 770 coupled to bus 710. I/O interface 740 can include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 can include an Ethernet adapter, wireless interconnection components, USB (universal serial bus), or other wired or wireless standards-based or proprietary interfaces.

Storage 760 can be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 can be generically considered to be a "memory," although memory 730 is the executing or operating memory to provide instructions to processor 720. Whereas storage 760 is nonvolatile, memory 730 can include volatile memory (i.e., the value or state of the data is indeterminate if power is interrupted to system 700).

Peripheral interface 770 can include any hardware interface not specifically mentioned above. Peripherals refer generally to devices that connect dependently to system 700. A dependent connection is one where system 700 provides the software and/or hardware platform on which operation executes, and with which a user interacts.

In one embodiment, memory 732 is a DRAM. In one embodiment, processor 720 represents one or more processors that execute data stored in one or more DRAM memories 732. In one embodiment, network interface 750 exchanges data with another device in another network location, and the data is data stored in memory 732. In one embodiment, system 700 includes ECC logic 780 to manage ECC and ECC data in the system. ECC logic 780 represents ECC logic to perform internal error correction and provide internal check bits in a CBRD mode in accordance with any embodiment described herein.

Figure 8:
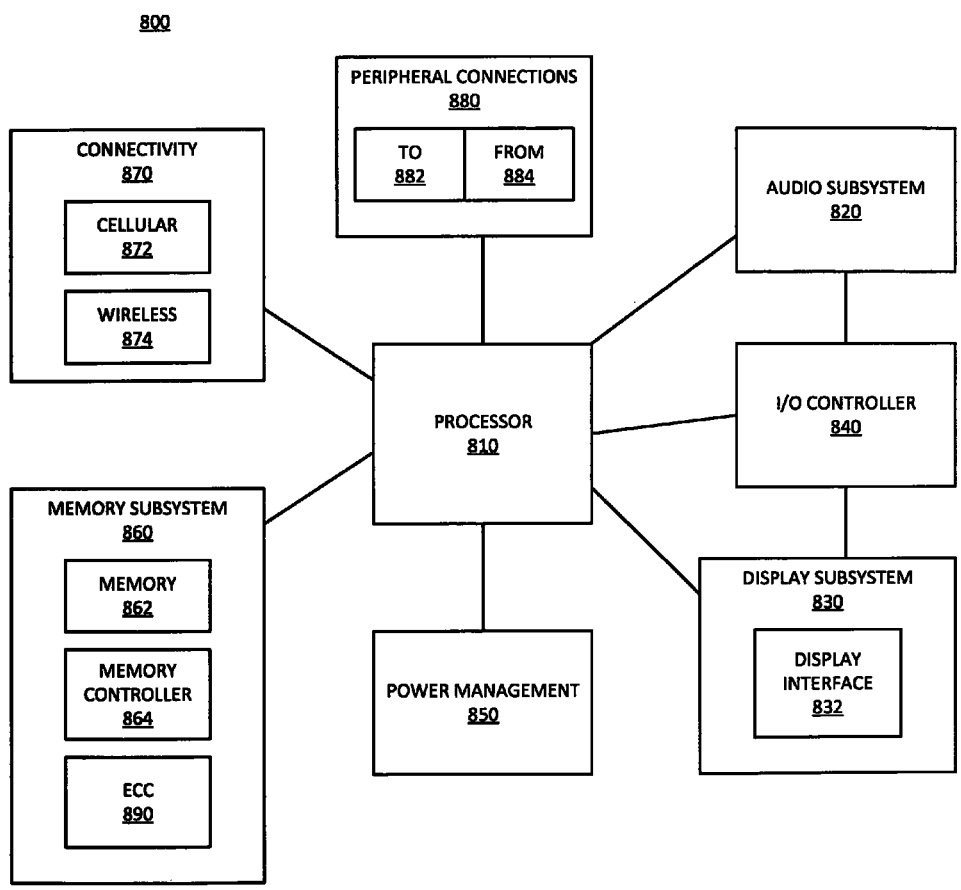
FIG. 8 is a block diagram of an embodiment of a mobile device in which a check bit read mode to read internal check bits can be implemented.

FIG. 8 is a block diagram of an embodiment of a mobile device in which a check bit read mode to read internal check bits can be implemented. Device 800 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user. In one embodiment, display subsystem 830 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features). In one embodiment, device 800 includes power management 850 that manages battery power usage, charging of the battery, and features related to power saving operation.

Memory subsystem 860 includes memory device(s) 862 for storing information in device 800. Memory subsystem 860 can include nonvolatile (state does not change if power to the memory device is interrupted) and/or volatile (state is indeterminate if power to the memory device is interrupted) memory devices. Memory 860 can store application data, user data, music, photos, documents, or other data, as well as system data (whether long-term or temporary) related to the execution of the applications and functions of system 800. In one embodiment, memory subsystem 860 includes memory controller 864 (which could also be considered part of the control of system 800, and could potentially be considered part of processor 810). Memory controller 864 includes a scheduler to generate and issue commands to memory device 862.

Connectivity 870 includes hardware devices (e.g., wireless and/or wired connectors and communication hardware) and software components (e.g., drivers, protocol stacks) to enable device 800 to communicate with external devices. The external device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory 862 is a DRAM. In one embodiment, processor 810 represents one or more processors that execute data stored in one or more DRAM memories 862. In one embodiment, system 800 includes ECC logic 890 to manage ECC and ECC data in the system. ECC logic 890 represents ECC logic to perform internal error correction and provide internal check bits in a CBRD mode in accordance with any embodiment described herein.

In one aspect, a dynamic random access memory device (DRAM) includes: a memory array including memory locations addressable with address information, the memory locations including data and internal check bits associated with the data, the DRAM to generate the internal check bits during an error checking operation; and I/O (input/output) circuitry to couple to an associated memory controller, the I/O circuitry to receive a read command when coupled to the associated memory controller, the read command to identify an address location; wherein in response to the read command, if the DRAM is configured for a check bit read (CBRD) mode, the read command to cause the DRAM to send internal check bits associated with the identified address location via the I/O circuitry, and if the DRAM is not configured for the CBRD mode, the read command to cause the DRAM to return data associated with the identified address location without exposing the internal check bits.

In one embodiment, the DRAM includes a double data rate version 4 extended (DDR4E) compliant synchronous dynamic random access memory device (SDRAM). In one embodiment, the DRAM includes a double data rate version 5 (DDR5) compliant synchronous dynamic random access memory device (SDRAM). In one embodiment, the internal check bits comprise eight bits of error correction coding (ECC) data. In one embodiment, the I/O circuitry is to output the check bits in CBRD mode one bit per burst cycle over a read burst length for the DRAM. In one embodiment, the I/O circuitry is to output one check bit on data signal line D[0] for each cycle of a burst length BL8. In one embodiment, the I/O circuitry is to provide the internal check bits to the associated memory controller for the memory controller to perform system-level ECC. In one embodiment, the DRAM is to expose the internal check bits to the associated memory controller as read only bits. In one embodiment, the read command is a standard read (RD) command, and if the command is any other type of read command, the memory device is to return an error. In one embodiment, the DRAM further comprising: a mode register including at least one bit to selectively configure the DRAM for the check bit read (CBRD) mode.

In one aspect, a method for error correction management in a memory subsystem includes: setting a mode register to configure a memory device for a check bit read mode; receiving a read command at the memory device, the read command to identify an address location; and responsive to receiving the read command, when the memory device is configured for the check bit read mode, sending internal check bits corresponding to the identified address location in response to the read command, the internal check bits generated internally within the memory device during an error checking operation of the memory device for use by the memory device, and when the memory device is not configured for the check bit read mode, returning data corresponding to the identified address location in response to the read command, without exposing the internal check bits. The method can include operations for execution of a method in accordance with any embodiment of a DRAM as set forth above.

In one aspect, a system with a memory subsystem includes: a memory controller to generate one or more read commands for associated dynamic random access memory devices (DRAMs), the read commands to include address location information; and multiple DRAMs including a storage array including memory locations addressable with address information, the memory locations including data and internal check bits associated with the data, the DRAM to generate the internal check bits during an error checking operation; and I/O (input/output) circuitry to couple to an associated memory controller, the I/O circuitry to receive a read command when coupled to the associated memory controller, the read command to identify an address location; wherein in response to the read command, if a DRAM is configured for a check bit read (CBRD) mode, the read command to cause the DRAM to send internal check bits associated with the identified address location via the I/O circuitry, and if the DRAM is not configured for the CBRD mode, the read command to cause the DRAM to return data associated with the identified address location without exposing the internal check bits.

A system can include a DRAM in accordance with any embodiment of a DRAM as set forth above. A system can include a memory controller in accordance with any embodiment of a memory controller as set forth above. A system can include a DRAM and a memory controller in accordance with any embodiment. In one embodiment, the system further including one or more processors coupled to execute data stored in one or more of the DRAMs. In one embodiment, the system further including a network interface coupled to the one or more processors, to exchange data between the one or more processors and a network location. In one embodiment, the system further including a display communicatively coupled to the one or more processors.

In one aspect, a memory controller for error correction management includes: command logic to generate a read command for an associated dynamic random access memory device (DRAM), the read command to include an address location; I/O (input/output) circuitry to couple to the associated DRAM, the I/O circuitry to send the read command when coupled to the associated DRAM; wherein when the DRAM is configured for a check bit read mode, the read command to cause the DRAM to return internal check bits corresponding to the address location, the internal check bits generated internally within the DRAM during an error checking operation of the DRAM for use by the DRAM, and wherein when the DRAM is not configured for the check bit read mode, the read command to cause the DRAM to return data corresponding to the address location without exposing the internal check bits.

In one embodiment, the DRAM includes a double data rate version 4 extended (DDR4E) compliant synchronous dynamic random access memory device (SDRAM). In one embodiment, the DRAM includes a double data rate version 5 (DDR5) compliant synchronous dynamic random access memory device (SDRAM). In one embodiment, the internal check bits comprise eight bits of error correction coding (ECC) data. In one embodiment, the I/O circuitry is to receive the check bits from the DRAM in CBRD mode one bit per burst cycle over a read burst length for the DRAM. In one embodiment, the I/O circuitry is to receive one check bit on data signal line D[0] for each cycle of a burst length BL8. In one embodiment, further comprising ECC logic to perform ECC at a system-level, including using the internal check bits as metadata for system-level ECC. In one embodiment, the memory controller is unable to write to the internal check bits of the DRAM. In one embodiment, the read command is a standard read (RD) command, and if the command is any other type of read command, the memory controller is to receive an error returned from the DRAM. In one embodiment, prior to the command logic to generate the read command, the command logic is further to generate a mode register set command to set a mode register of the DRAM to configure the DRAM for the check bit read mode.

In one aspect, a method for error correction management in a memory subsystem includes: setting a mode register to configure a memory device for a check bit read mode; sending a read command to the memory device, the read command to identify an address location; and responsive to receiving the read command, when the memory device is configured for the check bit read mode, receiving from the memory device internal check bits corresponding to the identified address location, the internal check bits generated internally within the memory device during an error checking operation of the memory device for use by the memory device, and when the memory device is not configured for the check bit read mode, receiving data corresponding to the identified address location in response to the read command, without receiving the internal check bits.

The method can include operations for execution of a method in accordance with any embodiment of a memory controller as set forth above.

In one aspect, a system with a memory subsystem includes: multiple DRAMs; and a memory controller associated with the DRAMs, the memory controller including command logic to generate a read command for an associated dynamic random access memory device (DRAM), the read command to include an address location; and I/O (input/output) circuitry to couple to the associated DRAM, the I/O circuitry to send the read command when coupled to the associated DRAM; wherein when the DRAM is configured for a check bit read mode, the read command to cause the DRAM to return internal check bits corresponding to the address location, the internal check bits generated internally within the DRAM during an error checking operation of the DRAM for use by the DRAM, and wherein when the DRAM is not configured for the check bit read mode, the read command to cause the DRAM to return data corresponding to the address location without exposing the internal check bits.

A system can include a DRAM in accordance with any embodiment of a DRAM as set forth above. A system can include a memory controller in accordance with any embodiment of a memory controller as set forth above. A system can include a DRAM and a memory controller in accordance with any embodiment. In one embodiment, the system further including one or more processors coupled to execute data stored in one or more of the DRAMs. In one embodiment, the system further including a network interface coupled to the one or more processors, to exchange data between the one or more processors and a network location. In one embodiment, the system further including a display communicatively coupled to the one or more processors.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:
1. A dynamic random access memory (DRAM) device, comprising:
   a memory array including memory locations addressable with address information, the memory locations including data and internal check bits associated with the data, the DRAM device to generate the internal check bits during an error checking operation; and I/O (input/output) circuitry to couple to an associated memory controller, the I/O circuitry to receive a read command when coupled to the associated memory controller, the read command to identify an address location;

wherein in response to the read command, if the DRAM device is configured for a check bit read (CBRD) mode, the read command to cause the DRAM device to send internal check bits associated with the identified address location via the I/O circuitry, and if the DRAM device is not configured for the CBRD mode, the read command to cause the DRAM device to return data associated with the identified address location without exposing the internal check bits.

2. The DRAM device of claim 1, wherein the DRAM device includes a double data rate version 4 extended (DDR4E) compliant synchronous dynamic random access memory device (SDRAM).

3. The DRAM device of claim 1, wherein the internal check bits comprise eight bits of error correction coding (ECC) data.

4. The DRAM device of claim 1, wherein the I/O circuitry is to output the check bits in CBRD mode one bit per burst cycle over a read burst length for the DRAM device.

5. The DRAM device of claim 4, wherein the I/O circuitry is to output one check bit on data signal line D[0] for each cycle of a burst length BL8.

6. The DRAM device of claim 1, wherein the I/O circuitry is to provide the internal check bits to the associated memory controller for the memory controller to perform system-level ECC.

7. The DRAM device of claim 1, wherein the DRAM device is to expose the internal check bits to the associated memory controller as read only bits.

8. The DRAM device of claim 1, wherein the read command is a standard read (RD) command, and if the command is any other type of read command, the memory device is to return an error.

9. The DRAM device of claim 1, the DRAM device further comprising:
a mode register including at least one bit to selectively configure the DRAM device for the check bit read (CBRD) mode.

10. A method for error correction management in a memory subsystem, comprising:
setting a mode register to configure a memory device for a check bit read mode;
receiving a read command at the memory device, the read command to identify an address location; and
responsive to receiving the read command,
when the memory device is configured for the check bit read mode, sending internal check bits corresponding to the identified address location in response to the read command, the internal check bits generated internally within the memory device during an error checking operation of the memory device for use by the memory device, and
when the memory device is not configured for the check bit read mode, returning data corresponding to the identified address location in response to the read command, without exposing the internal check bits.

11. The method of claim 10, wherein the internal check bits comprise eight bits of error correction coding (ECC) data.

12. The method of claim 10, wherein sending the check bits comprises sending one bit per burst cycle over a read burst length for the memory device.

13. The method of claim 10, wherein setting the mode register comprises writing a bit in the mode register in response to a mode register set command sent by a memory controller to the memory device.

14. A memory controller for error correction management, comprising:
command logic to generate a read command for an associated dynamic random access memory (DRAM) device, the read command to include an address location;
I/O (input/output) circuitry to couple to the associated DRAM device, the I/O circuitry to send the read command when coupled to the associated DRAM device;
wherein when the memory device is configured for a check bit read mode, the read command to cause the memory device to return internal check bits corresponding to the address location, the internal check bits generated internally within the memory device during an error checking operation of the memory device for use by the memory device, and
wherein when the memory device is not configured for the check bit read mode, the read command to cause the memory device to return data corresponding to the address location without exposing the internal check bits.

15. The memory controller of claim 14, wherein the DRAM device includes a double data rate version 5 (DDR5) compliant synchronous dynamic random access memory (SDRAM) device, and the memory controller is to receive the internal check bits from the DDR5 SDRAM device one bit each cycle of a read burst length for the SDRAM device.

16. The memory controller of claim 14, wherein prior to the command logic to generate the read command, the command logic is further to generate a mode register set command to set a mode register of the DRAM device to configure the DRAM device for the check bit read mode.

17. A system with a memory subsystem, comprising:
a memory controller to generate one or more read commands for associated dynamic random access memory (DRAM) devices, the read commands to include address location information; and
multiple DRAM devices including
a storage array including memory locations addressable with address information, the memory locations including data and internal check bits associated with the data, the DRAM device to generate the internal check bits during an error checking operation; and
I/O (input/output) circuitry to couple to an associated memory controller, the I/O circuitry to receive a read command when coupled to the associated memory controller, the read command to identify an address location;
wherein in response to the read command, if a DRAM device is configured for a check bit read (CBRD) mode, the read command to cause the DRAM device to send internal check bits associated with the identified address location via the I/O circuitry, and if the DRAM device is not configured for the CBRD mode, the read command to cause the DRAM device to return data associated with the identified address location without exposing the internal check bits.

18. The system of claim 17, wherein the internal check bits comprise error correction coding (ECC) bits, which the memory controller reads to perform system-level ECC.

19. The system of claim 17, further comprising one or more processors coupled to execute data stored in one or more of the DRAM devices.

20. The system of claim 19, further comprising a network interface coupled to the one or more processors, to exchange data between the one or more processors and a network location.

21. The system of claim 19, further comprising a display communicatively coupled to the one or more processors.

* * * * *